US012767520B2

(12) United States Patent
Schirg

(10) Patent No.: US 12,767,520 B2
(45) Date of Patent: Oct. 20, 2026

(54) ACOUSTIC MODULE WITH A CENTERED SOUND PORT

(71) Applicant: Soundskrit Inc., Montreal (CA)

(72) Inventor: Anton Schirg, Montreal (CA)

(73) Assignee: Soundskrit Inc., Montreal (CA)

( * ) Notice: Subject to any disclaimer, the term of this patent is extended or adjusted under 35 U.S.C. 154(b) by 120 days.

(21) Appl. No.: 18/797,342

(22) Filed: Aug. 7, 2024

(65) Prior Publication Data

US 2025/0051155 A1 Feb. 13, 2025

Related U.S. Application Data

(60) Provisional application No. 63/531,165, filed on Aug. 7, 2023.

(51) Int. Cl.
*B81B 7/00* (2006.01)
*G10K 11/178* (2006.01)
*H04R 1/40* (2006.01)

(52) U.S. Cl.
CPC ...... *B81B 7/0061* (2013.01); *G10K 11/17853* (2018.01); *H04R 1/406* (2013.01); (Continued)

(58) Field of Classification Search
CPC ........... B81B 7/00; G10K 11/178; H04R 1/40
See application file for complete search history.

(56) References Cited

U.S. PATENT DOCUMENTS

2017/0041692 A1* 2/2017 Watson et al. ......... H04R 1/023
2018/0041843 A1* 2/2018 Sibbald et al. ........ H04R 19/04
(Continued)

FOREIGN PATENT DOCUMENTS

WO WO2021/174372 * 9/2021 ............... H04R 1/38
WO WO-2021174372 A1 * 9/2021 ............ H05K 1/181
(Continued)

OTHER PUBLICATIONS

Angelo Farina, "Simultaneous measurement of impulse response and distortion with a swept-sine technique", Presented at the 108th Convention Feb. 19-22, 2000 Paris, France.
(Continued)

*Primary Examiner* — Jason Chan
(74) *Attorney, Agent, or Firm* — Lempia Summerfield Katz LLC

(57) ABSTRACT

An acoustic module includes a plurality of acoustic sensor devices and a plurality of sound ports configured to couple the plurality of acoustic sensor devices to an ambient environment. The plurality of acoustic sensor devices includes at least a first acoustic sensor device and a second acoustic sensor device. The plurality of sound ports includes at least a first sound port, a second sound port, and a third sound port. The first acoustic sensor device includes a first transducer having a first side coupled to an ambient environment via the first sound port and a second side coupled to the ambient environment via the second sound port. The second acoustic sensor device includes a second transducer exposed to the ambient environment on one side via the third sound port. The first sound port, the second sound port, and the third sound port are positioned in the acoustic module such that the third sound port is at least approximately aligned with a midpoint between the first sound port and the second sound port.

19 Claims, 8 Drawing Sheets

(52) U.S. Cl.
CPC ................. *B81B 2201/0257* (2013.01); *B81B 2203/0127* (2013.01); *H04R 2201/003* (2013.01)

(56) References Cited

U.S. PATENT DOCUMENTS

| | | | | |
|---|---|---|---|---|
| 2025/0033953 | A1* | 1/2025 | Gupta et al. | .......... B81B 7/0061 |
| 2025/0206600 | A1 | 6/2025 | Hsu et al. | |

FOREIGN PATENT DOCUMENTS

| | | | | |
|---|---|---|---|---|
| WO | WO2024/238857 | * | 11/2024 | ............... H04R 1/40 |
| WO | WO-2024238857 A1 | * | 11/2024 | ............. H04R 1/406 |

OTHER PUBLICATIONS

"Window Method for FIR Filter Design", Spectral Audio Signal Processing by Julius O. Smith III, W3K Publishing, 2011, ISBN 978-0-9745607-3-1 Copyright © Mar. 31, 2026 by Julius O. Smith III, Center for Computer Research in Music and Acoustics (CCRMA.

* cited by examiner

ACOUSTIC MODULE WITH A CENTERED SOUND PORT

CROSS-REFERENCES TO RELATED APPLICATIONS

This application claims the benefit of U.S. provisional application entitled "Microphone Assembly with Centered Port," filed Aug. 7, 2023, and assigned Ser. No. 63/531,165, the entire disclosure of which is hereby expressly incorporated by reference.

BACKGROUND OF THE DISCLOSURE

Field of the Disclosure

The disclosure relates generally to acoustic sensor devices that as microelectromechanical system (MEMS) microphones.

Brief Description of Related Technology

Traditional omnidirectional acoustic sensors (e.g., microphones) measure the pressure of incoming sound. A transducer, or membrane, that moves in response to the incoming sound is encapsulated in a package. The transducer partitions the package into two air volumes, a front air volume and a back air volume. The microphone package has a sound port that couples one of the air volumes to the outside ambient environment (e.g., ambient air). As sound hits the microphone, the sound couples into one of the air volumes through the sound port and changes the pressure. This creates a difference in pressure between the front air volume and the back air volume that creates a force on the transducer and drives its motion. In this configuration, the omnidirectional microphone responds equally to sound travelling at all directions.

Directional acoustic sensors, on the other hand, use two sound ports, exposing each opposing side of the transducer to the ambient environment. They are designed to have high sensitivity to sound travelling in one direction and low sensitivity to sound travelling in another direction. Directionality allows the acoustic sensor to separate sound sources.

Capturing sound using a combination of a directional microphone and an omnidirectional microphone is useful in consumer electronics devices. For example, if the directional microphone has a dipole polar pattern, an output of the directional microphone can be combined via data processing with an output of the omnidirectional microphone to give a number of different directional patterns, including but not limited to cardioid, hypercardioid, supercardioid, subcardioid, and other cardioid-like beam patterns.

SUMMARY OF THE DISCLOSURE

In accordance with one aspect of the disclosure, an acoustic module includes a plurality of acoustic sensor devices and a plurality of sound ports configured to couple the plurality of acoustic sensor devices to an ambient environment. The plurality of acoustic sensor devices includes at least a first acoustic sensor device and a second acoustic sensor device. The plurality of sound ports includes at least a first sound port, a second sound port, and a third sound port. The first acoustic sensor device includes a first transducer having a first side coupled to an ambient environment via the first sound port and a second side coupled to the ambient environment via the second sound port. The second acoustic sensor device includes a second transducer exposed to the ambient environment on one side via the third sound port. The first sound port, the second sound port, and the third sound port are positioned in the acoustic module such that the third sound port is at least approximately aligned with a midpoint between the first sound port and the second sound port.

In accordance with another aspect of the disclosure, an acoustic module includes a first acoustic sensor device including a first transducer having a first side coupled to an ambient environment via a first acoustic channel coupled to a first sound port and a second side coupled to the ambient environment via a second acoustic channel coupled to a second sound port such that the first acoustic sensor device exhibits a directional response to soundwaves in the ambient environment. The acoustic module also includes a second acoustic sensor device including a second transducer exposed to the ambient environment on one side via a third acoustic channel coupled to a third sound port such that the second acoustic sensor device exhibits an omnidirectional response to the soundwaves in the ambient environment. The first sound port, the second sound port, and the third sound port are positioned in the acoustic module such that the third sound port is at least approximately aligned with a midpoint between the first sound port and the second sound port.

In connection with any one of the aforementioned aspects, the devices, modules and/or methods described herein may alternatively or additionally include or involve any combination of one or more of the following aspects or features. The first sound port is spaced from the second sound port by a distance along a line connecting the first sound port and the second sound port. The midpoint lies at least approximately halfway along the distance between the first sound port and the second sound port. The third sound port is disposed at a position along an axis that is approximately perpendicular to the line connecting the first sound port and the second sound port. The third sound port is disposed at a position along the axis within a plane that i) is perpendicular to the line connecting the first sound port and the second sound port and ii) crosses the line connecting the first sound port and the second sound port at the midpoint. The third sound port is positioned at the midpoint between the first sound port and the second sound port. Each of one or both of the first transducer and the second transducer comprises a microelectromechanical system (MEMS) transducer. Each of one or both of the first acoustic sensor device and the second acoustic sensor device comprises a microelectromechanical system (MEMS) microphone. The first acoustic sensor device is configured to have a directional response to sound waves in the ambient environment. The second acoustic sensor device is configured to have an omnidirectional response to sound waves in the ambient environment. The first acoustic sensor device is configured to have a dipole directionality pattern. The first acoustic sensor device and the second acoustic sensor device are coupled to a processor configured to combine a first signal generated by the first acoustic sensor device and a second signal generated by the second acoustic sensor device to generate a combined output signal of the acoustic module. The processor is configured to combine the first signal generated by the first acoustic sensor device and the second signal generated by the first acoustic sensor device to generate a combined output signal having one of a cardioid directionality pattern, a hypercardioid directionality pattern, a supercardioid directionality pattern, or a subcardioid directionality pattern. The processor is configured to, prior to combining the first signal and the second signal, filter the first signal and the second signal so that one or both i) a frequency response of the first signal matches a frequency response of the second signal and ii) a phase response of the first signal matches a phase response of the second signal.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1A:
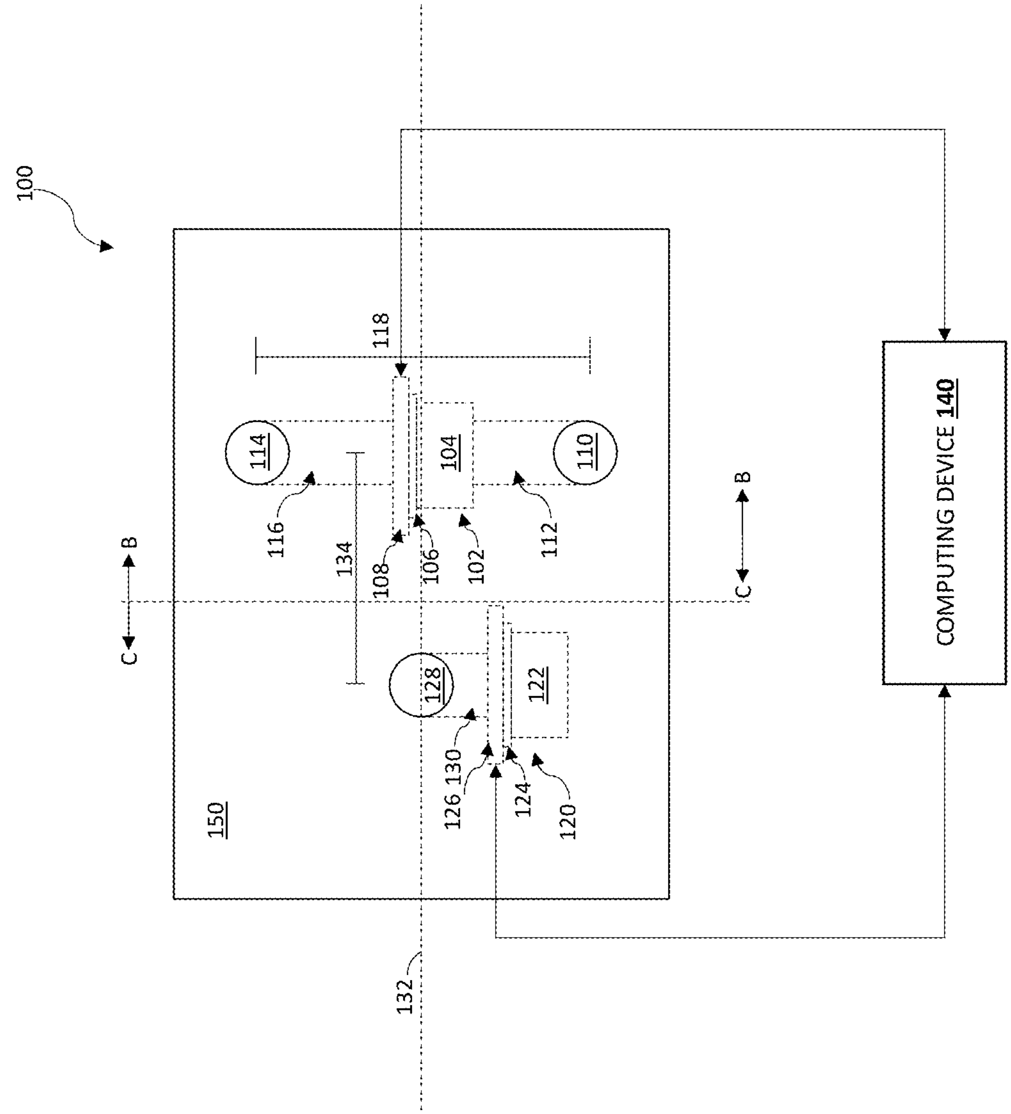
FIG. 1A depicts a top view of an acoustic module including an omnidirectional acoustic sensor device and a directional acoustic sensor in accordance with an example.

The embodiments of the disclosed devices may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

As discussed above, capturing sound using a combination of a directional acoustic sensor device (e.g., a directional microphone) and an omnidirectional acoustic sensor device (e.g., an omnidirectional microphone) is useful in consumer electronics devices. For example, if a directional microphone has a dipole polar pattern, an output of the directional microphone may be combined via data processing with an output of an omnidirectional microphone to give a number of different directional patterns, including but not limited to cardioid, hypercardioid, supercardioid, subcardioid, and other cardioid-like beam patterns.

In an ideal scenario, both the directional acoustic sensor device and omnidirectional acoustic sensor device sample the sound at the same point (e.g., the sound ports of the two acoustic sensor devices are perfectly coincident). However, in at least some examples, the sound ports of the two acoustic sensor devices have some distance therebetween due to physical limitations. Additionally, in at least some examples, the sensitivity of the directional acoustic sensor device increases as the distance between its two sound ports increases, thereby leading to further separation of the sound ports in a system using an omnidirectional acoustic sensor device and a directional acoustic sensor device. In at least some cases, this distance between the sound ports creates frequency dependent effects that compromise the directionality of the system when trying to combine the two acoustic sensor device signals to create, for instance, a cardioid-like beam pattern.

Given the constraint that the sound port of the omnidirectional acoustic sensor device cannot be perfectly coincident with the sound ports of the directional acoustic sensor device, there is a useful location for the omnidirectional microphone sound port relative to the directional microphone. The location of the sound port of the omnidirectional acoustic sensor device may be used to realize a system architecture in which frequency dependencies created by combining the dipole and omnidirectional microphone signals are minimized or otherwise reduced.

Acoustic modules with an omnidirectional acoustic sensor device having a centered port are described. The centered port may be at least approximately aligned with, or otherwise positioned at, a midpoint between two sound ports of a directional acoustic sensor device that may be integrated together with the omnidirectional acoustic sensor device in the acoustic module. As described herein, the centered port may be defined in a gasket of the acoustic module assembly.

In some examples, the disclosed devices, modules, or systems having a centered port are configured to implement, or are coupled to a processor configured to implement, a signal processing method in which output signals from the omnidirectional acoustic sensor device and the directional acoustic sensor device are summed or otherwise combined. The combination may follow processing by respective phase matching and weighting filters. The signal processing method may further include additional filtering after the combination, including, for instance, frequency response matching.

The positioning and/or orientation of the omnidirectional acoustic sensor device relative to the directional acoustic sensor device may vary. The examples shown in the drawing figures thus depict one of several possible orientations and positions.

The configuration, construction, and other characteristics of the gasket of the disclosed devices may vary. For instance, the gasket may or may not have a unitary, or one-piece, construction. In some examples, the gasket may be or include a composite structure or arrangement including a number of different materials.

The configuration, construction, and other characteristics of the omnidirectional acoustic sensor device and/or the directional acoustic sensor device of the disclosed acoustic modules may also vary. For instance, the omnidirectional acoustic sensor device and/or the directional acoustic sensor device may or may not include a MEMS transducer.

Although generally described in connection with microphones, the disclosed acoustic modules with a centered sound port may be used in other applications and contexts. For instance, the disclosed acoustic modules with a centered sound port are useful in connection with accelerometers, gyroscopes, inertial sensors, pressure sensors, gas sensors, etc. The disclosed acoustic modules with a centered sound port are described in the context of excitation by sound waves. However, alternative or additional stimuli may excite acoustic sensor devices of the acoustic modules with a centered sound port in other contexts.

FIG. 1A depicts a top view of an acoustic module 100 in accordance with one example. The acoustic module 100 includes a directional acoustic sensor device 102 and an omnidirectional acoustic sensor device 120 supported by, or housed or otherwise disposed in, a gasket 150. The directional acoustic sensor device 102 may be a directional microphone, for example. The omnidirectional acoustic sensor device 120 may be an omnidirectional microphone, for example. The directional acoustic sensor device 102 includes a lid 104 and a printed circuit board (PCB) 106. The directional acoustic sensor device 102 may be further supported by and mounted on a product PCB 108. In some examples, the product PCB 108 may be or otherwise include a flexible printed circuit board. The directional acoustic sensor device 102 includes a first transducer having one side coupled to a first sound port 110 (sometimes referred to herein as a "front sound port") in the gasket 150 via a first acoustic channel 112 (sometimes referred to herein as a "front acoustic channel"). The transducer of directional acoustic sensor device 102 has a second side coupled to a second sound port 114 (sometimes referred to herein as a "back sound port") in the gasket 150 via a second acoustic channel 116 (sometimes referred to herein as a "back sound port") in the gasket 150. The front sound port 110 and back sound port 114 are spaced apart from one another by a distance 118. The distance 118 may be defined as the distance between the centers of the sound ports 110 and 114, for example. In some examples, the directional acoustic sensor device 102 may exhibit a dipole response, picking up sound parallel to the distance 118, while rejecting sound perpendicular to the distance 118. By increasing the distance 118, the sensitivity of the directional acoustic sensor device 102 may increase, while the directional response at high frequencies degrades. By reducing the distance 118, the directional response at high frequencies may improve, but the sensitivity may be reduced.

In the example of FIG. 1A, the omnidirectional acoustic sensor device 120 includes a lid 122 and a microphone PCB 124. The omnidirectional acoustic sensor device 120 is further supported by and mounted on a product PCB 126. In some examples, the product PCB 126 might be or otherwise include a flexible printed circuit board. In some examples, the product PCB 108 and the product PCB 126 may be connected or otherwise integrated. In an example, the product PCB 108 and the product PCB 126 may comprise a single product PCB. The omnidirectional acoustic sensor device 120 is coupled to a third sound port 128 (sometimes referred to herein as a "centered sound port") in the gasket 150 via an omnidirectional acoustic channel 130.

The directional acoustic sensor device 102 has a midpoint 132 between the front sound port 110 and back sound port 114 that is positioned at or about halfway along the distance 118. The midpoint 132 may establish an axis or plane as shown. The centered sound port 128 is at least approximately aligned with the midpoint 132. The centered sound port 128 may be disposed at any position along the axis or within the plane defined by the midpoint 132. For example, the centered sound port 128 may be disposed at a position along the axis that is approximately perpendicular to a line connecting the first sound port 110 and the second sound port 114. In an example, the centered sound port 128 may be disposed at a position along the axis within a plane that i) is perpendicular to the line connecting the first sound port 110 and the second sound port 114 and ii) crosses the line connecting the first sound port 110 and the second sound port 114 at the midpoint 132. In some examples, the centered sound port 128 is positioned at the midpoint 132 between the first sound port 110 and the second sound port 114.

In the example shown, the centered sound port 128 is spaced from the front sound port 110 and back sound port 114 by a distance 134. The distance 134 may vary in various examples.

The acoustic module 100 may include or be coupled to a computing device 140. The computing device 104 may be or include a processor of the end-product device into which the acoustic module 100 is integrated, for example. In some examples, the computing device 140 may be external to the end-product device into which the acoustic module 100 is integrated. For example, the computing device 140 may be a processor of a computer or other electronic device that may be externally connected to the end-product device into which the acoustic module 100 is integrated. In yet another example, the computing device 140 may be internal to the acoustic module 100 and/or at least a portion of functionality described herein with reference to the computing device 140 may be performed internally to the acoustic module 100.

The computing device 140 may be configured to combine an output signal of the omnidirectional acoustic sensor device 120 with an output signal of the directional acoustic sensor device 102 to create a cardioid beam pattern. In some examples, the computing device 104 may be configured to equalize the output signal of the omnidirectional acoustic sensor device 120 and the output signal of the directional acoustic sensor device 104 to have a similar sensitivity and then sum the equalized output signals together to create a cardioid beam pattern. The shorter the distance 134, the more frequency independent the cardioid beam pattern will be. In other words, the cardioid beam pattern will not degrade across the audio spectrum of frequencies. However, even if the distance 134 is large, as long as the centered sound port 128 remains aligned with midpoint 132, the resulting cardioid output will remain relatively stable and frequency independent as opposed to if it were offset by the same distance but in a direction parallel to 118. The further the centered sound port 128 extends away from midpoint 132, the more frequency independent or unstable the cardioid output becomes.

It should be noted that the gasket 150 may be composed of, or otherwise include, one or multiple gasket pieces to ensure good sealing of the embedded acoustic sensor devices. The gasket 150 may be composed of, or otherwise include, rubber, foam, adhesives, plastic, metal, and/or other materials.

Figure 1B:
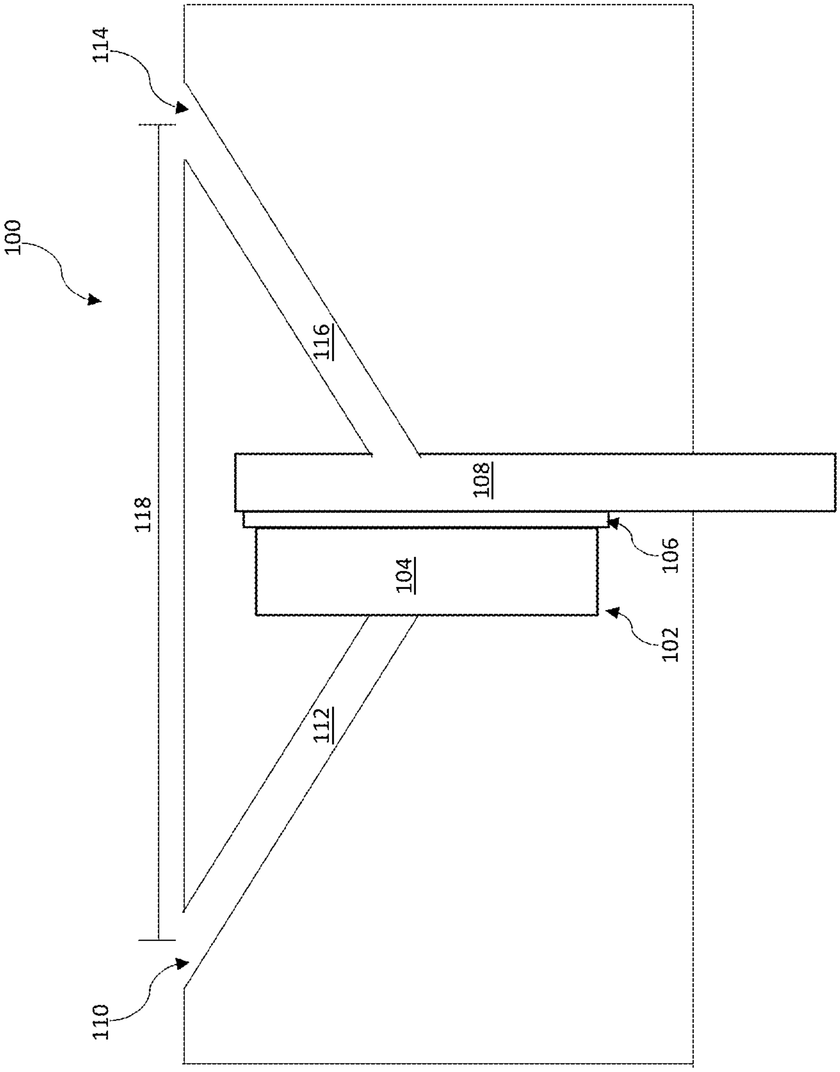
FIG. 1B depicts a cross-section view of the acoustic module of FIG. 1A.

FIG. 1B depicts a cross-section view of the acoustic module 100 along the direction B indicated in FIG. 1A. As described above, the directional acoustic sensor device 102 includes the lid 104 and the PCB 106. The directional acoustic sensor device 102 is further supported by and mounted on the product PCB 108. The directional acoustic sensor device 102 is coupled to the front sound port 110 in the gasket 150 through a front acoustic channel 112 and the back sound port 114 through a back acoustic channel 116. The front sound port 110 and the back sound port 114 have a distance 118 between them. In this example, the acoustic channels 112, 116 are disposed in a V-shaped configuration.

Figure 1C:
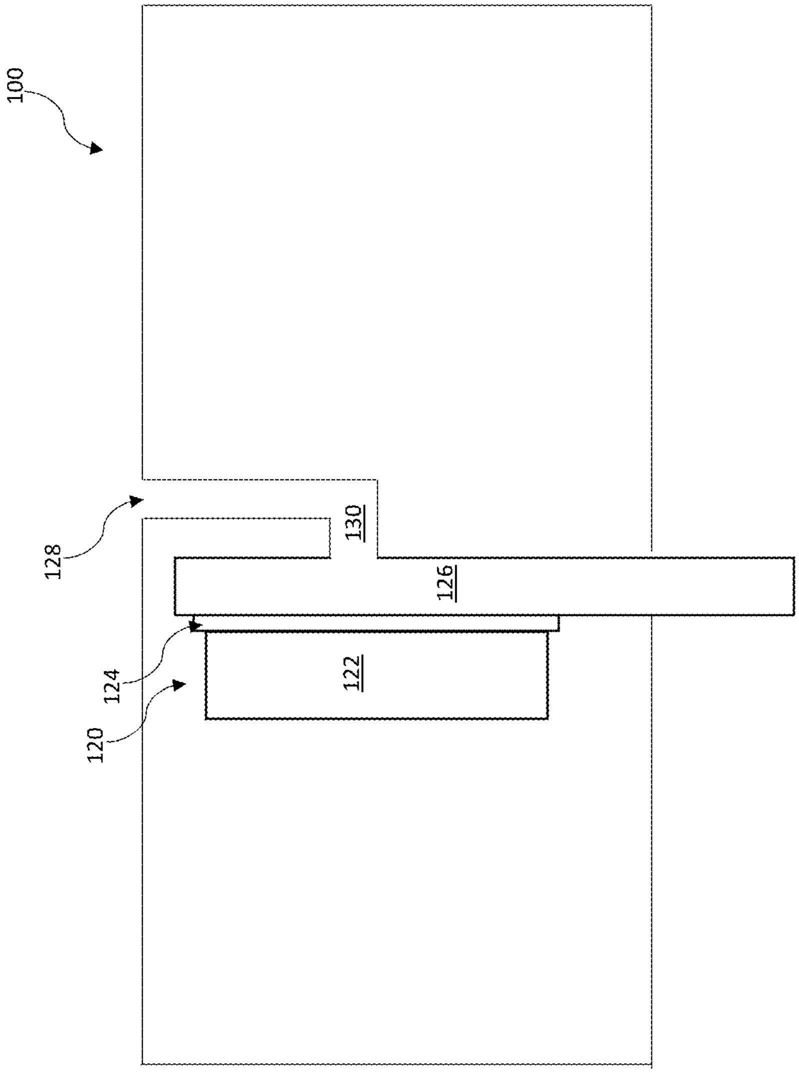
FIG. 1C depicts another cross-section view of the acoustic module of FIG. 1A.

FIG. 1C depicts a cross-section view of the acoustic module 100 along the direction C indicated in FIG. 1A. As described above, the omnidirectional acoustic sensor device 120 includes the lid 122 and the PCB 124. The omnidirectional acoustic sensor device 120 is further supported by and mounted on the product PCB 126. The omnidirectional acoustic sensor device 120 is coupled to the centered sound port 128 in the gasket 150 through the omnidirectional acoustic channel 130.

Figure 2:
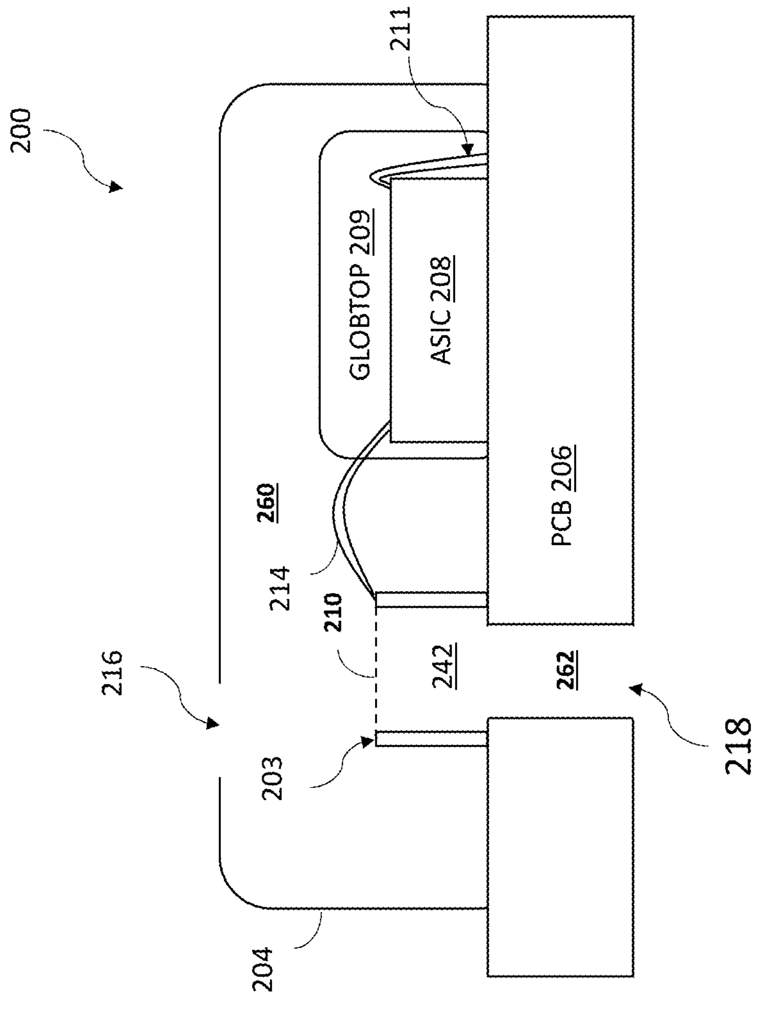
FIG. 2 is a block diagram of an example directional acoustic sensor device that may be utilized in the acoustic module of FIG. 1, in accordance with an example.

Turning now to FIG. 2, a cross-sectional, schematic view of an acoustic sensor device 200 configured as a directional acoustic sensor device, according to an example, is depicted. The acoustic sensor device 200 may be a microphone, for example. The acoustic sensor device 200 may correspond to the acoustic sensor device 102 of FIG. 1A, in an example. In other examples, the acoustic sensor device 100 of FIG. 1A may be different from the acoustic sensor device 200. The acoustic sensor device 200 may include a transducer 203. The transducer 203 may be a MEMS transducer, for example. In other examples, however, the transducer 203 may comprise a suitable transducer other than a MEMS transducer. The transducer 203 may be attached to or otherwise supported by a PCB or other substrate 206 (generally referred to herein as "PCB 206"). The PCB 206 may comprise one or more layers. In an example in which the PCB 206 comprises multiple layers, respective ones of the multiple layers may be separated from one another by a dielectric material. The one or more layers of the PCB 206 may include conductive traces that may route electrical signals in the PCB 206. The acoustic sensor device 200 may also include a lid or other enclosure 212 (generally referred to herein as "lid 204"). The lid 204 may be placed over the PCB 206 to enclose the components of the acoustic sensor device 200 mounted on or otherwise attached to the PCB 206. The lid 204 may be composed of, or otherwise include, a metal, plastic, ceramic, or other material. The lid 204 and the PCB 206 may form a package of the acoustic sensor device 200. In other examples, a package of the acoustic sensor device 200 may be formed in other suitable manners. The transducer 203 may include a diaphragm or other sensing element 210 positioned over a cavity 242. The cavity 242 may be formed in the first MEMS transducer 203 through various microfabrication practices including, for instance, deep reactive ion etching (DRIE). The diaphragm 210 includes a first side that faces outwards with respect to the cavity 242 and a second side that faces the cavity 242. In an example, the diaphragm 210 may comprise a cantilever diaphragm structure that is attached on one end and is free to move on the other end. In another examples, the diaphragm 210 may comprise another suitable structure, such as a fixed-fixed structure that is fixed on more than two sides, such as a diaphragm that is fixed or anchored on all sides around the perimeter.

The acoustic sensor device 200 may include a first sound port 216 formed in the lid 204 and a second sound port 218 formed in the PCB 206. A first air volume 260 may be formed in the package of the acoustic sensor device 200 between the PCB 206 and the lid 204 and may be configured to be exposed to the ambient environment via the first sound port 216. Referring to FIG. 1A, in an example, the first sound port 216 may be coupled to the first sound port 110 via the acoustic channel 112 in the gasket 150. A second air volume 262 may comprise the cavity 242 in the MEMS transducer 203 and may be configured to be exposed to the ambient environment via the second sound port 218. Referring to FIG. 1A, in an example, the second sound port 218 may be coupled to the second sound port 114 via the acoustic channel 116 in the gasket 150. The diaphragm or other sensing element 210 may thus have two opposing sides exposed to the ambient environment, and may sense a pressure gradient between the opposing sides of the diaphragm 210 exposed to the ambient environment. Because the diaphragm 210 of the MEMS transducer 203 has two opposing sides that are exposed to the ambient environment, and thus the first transducer 203 senses the pressure gradient between the opposing sides of the diaphragm 210 exposed to the ambient environment, the MEMS transducer 203 produces a directional polar pattern. For example, the MEMS transducer 203 may produce a dipole, or FIG. 8, polar pattern.

The acoustic sensor device 200 may also include an ASIC 208. The ASIC 208 may correspond to the one or more IC devices 105*a* in FIG. 1. The ASIC 208 may be mounted on or otherwise attached to the PCB 206. The ASIC 208 may be covered by a globtop 209. The ASIC 208 may be electrically coupled to the MEMS transducer 203. For example, the MEMS transducer 203 and ASIC 208 may be electrically connected by wire bonds 214, either directly to each other, or via traces on the PCB 206. The ASIC 208 may also be electrically connected to the PCB 206 by wire bonds 211. In other examples, the MEMS transducer 203 and the ASIC 208 may be attached and/or electrically coupled using other suitable methods. For example, the MEMS transducer 203 may be attached to the PCB 206 using flip chip technology.

The ASIC 208 may be configured to read out electrical signals generated by the MEMS transducer 203 based on movement of the diaphragm 210, and to generate a sensor output based on the electrical signals read out from the first transducer 203. In an example, the ASIC 208 may generate a directional (e.g., a dipole) sensor output signal based on the electrical signals read out from the transducer 203. The sensor output generated by the ASIC 208 may be provided for further processing to an external computing device, such as, for example, the computing device 140 in FIG. 1A.

Figure 3:
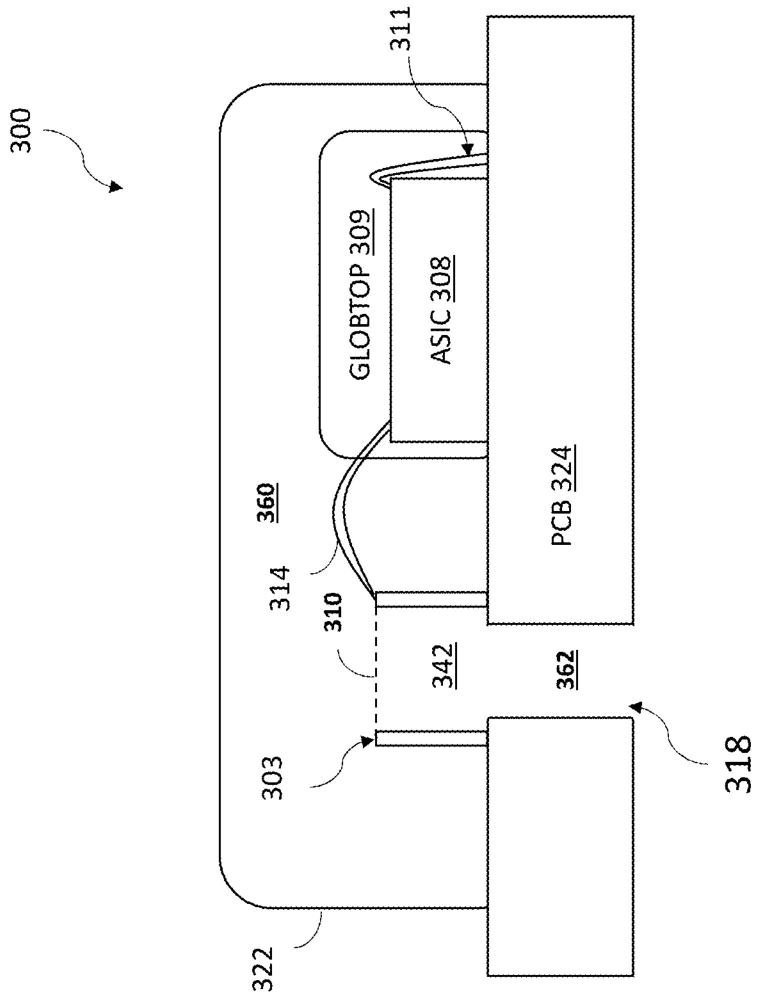
FIG. 3 is a block diagram of an example omnidirectional acoustic sensor device that may be utilized in the acoustic module of FIG. 1, in accordance with an example.

Turning now to FIG. 3, a cross-sectional, schematic view of an acoustic sensor device 300 configured as an omnidirectional acoustic sensor device, according to an example, is depicted. The acoustic sensor device 300 may be a microphone, for example. The acoustic sensor device 300 may correspond to the omnidirectional acoustic sensor device 120 of FIG. 1A, in an example. In other examples, the acoustic sensor device 120 of FIG. 1A may be different from the acoustic sensor device 300. The acoustic sensor device 300 is generally similar to the acoustic sensor device 200 of FIG. 2 and includes like-numbered elements with the acoustic sensor device 200 that are not discussed in detail below for the purpose of brevity. The acoustic sensor 300 includes a lid 322 generally corresponding to the lid 204 of the acoustic sensor device 200 of FIG. 2 and a PCB 324 generally corresponding to the PCB 206 of acoustic sensor device 200 of FIG. 2. Unlike the acoustic sensor device 200 of FIG. 2 that includes two sound ports 216, 218, the acoustic sensor device 300 includes only a single sound port 318. The lid 322 of the acoustic sensor device 300 does not include a sound port. Thus, the air volume 360 of the acoustic sensor device 300 is at least substantially sealed from the ambient environment.

The sound port 318 may be configured to expose one side of a diaphragm 310 of the acoustic sensor device 300 to the ambient environment, while the other side of the diaphragm 310 may be exposed to the sealed air volume 360. Referring to FIG. 1A, in an example, the sound port 318 may be coupled to the centered sound port 128 via the acoustic channel 130 in the gasket 150. In some examples, the air volume 360 is generally sealed from the ambient environment but the acoustic sensor device 300 may include a vent hole or other small opening (e.g., in the lid 312) exposing the air volume 360 to the ambient environment to equalize the direct current (DC), or low frequency, pressure changes in the ambient environment. Because the diaphragm 310 is exposed on only one side to the ambient environment and is exposed on the other side to the sealed air volume 360, the MEMS transducer 303 may sense pressure at the single exposed side of the diaphragm 310 exposed to the ambient environment relative to a reference pressure in the sealed air volume 360. The MEMS transducer 303 may therefore produce an omnidirectional polar pattern.

In an example, the diaphragm 310 of the acoustic device 300 may have the same structure as the diaphragm 210 of the acoustic device 200 of FIG. 2. In another example, the diaphragm 310 of the acoustic device 300 may have a different structure from the diaphragm 210 of the acoustic device 200 of FIG. 2. For example, the diaphragm 210 and the diaphragm 310 may comprise different structures that are optimized for, respectively, directional sensing operation and omnidirectional sensing operation. As just an example, the diaphragm 210 may comprise a cantilever diaphragm structure that is attached on one end and is free to move on the other end, and the diaphragm 310 may comprise a fixed-fixed structure that is fixed on both ends or is fixed around the perimeter, or vice versa. In other examples, the diaphragm 210 and/or the diaphragm 310 may comprise another suitable structure.

Figure 4:
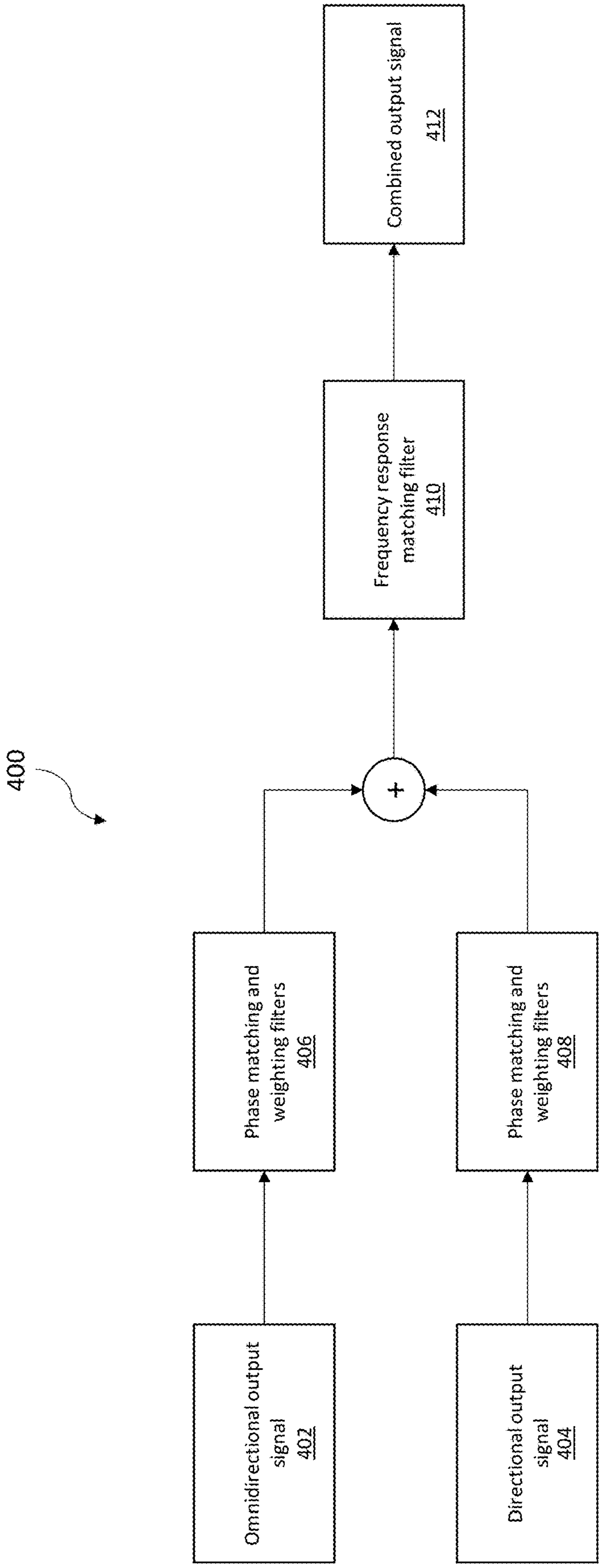
FIG. 4 is a block diagram of a system for signal processing of outputs of an omnidirectional acoustic sensor device and a directional acoustic sensor device in accordance with an example.

FIG. 4 is a block diagram of a method or system 400 for signal processing outputs of an omnidirectional acoustic sensor device and a directional acoustic sensor device, in accordance with an example. The method or system 400 may be implemented by the computing device 140 of FIG. 1A, for example. An omnidirectional output signal 402 may be generated by an omnidirectional acoustic sensor device (e.g., the omnidirectional acoustic sensor device 120 of FIG. 1A) and a directional output signal 404 may be generated by a directional acoustic sensor device (e.g., the directional acoustic sensor device 102 of FIG. 1A) a directional signal 404. In some examples, the directional output 404 may correspond to a dipole pattern. The omnidirectional output signal 402 and directional output signal 404 may be filtered so that the frequency responses thereof and phase responses thereof match one another. In this example, the omnidirectional output signal 402 is passed through the omnidirectional phase matching and weighting filters 406, and the directional output signal 404 is passed through the directional phase matching and weighting filters 408. The phase matching and weighting filters 406 and 408 match the frequency response and phase response of the omnidirectional and directional microphones. The filtered outputs of the filters 406 and 408 are added together. The resulting sum is then further passed through a frequency response matching filter 410. The filter 410 may be configured to equalize or flatten the frequency response of the summed output to be similar to that of the omnidirectional microphone. Finally, a combined output signal 412 is calculated. In some examples, the combined output signal may provide a directional audio output corresponding to a cardioid, hypercardioid, supercardioid, or subcardioid directionality pattern.

Figure 5A:
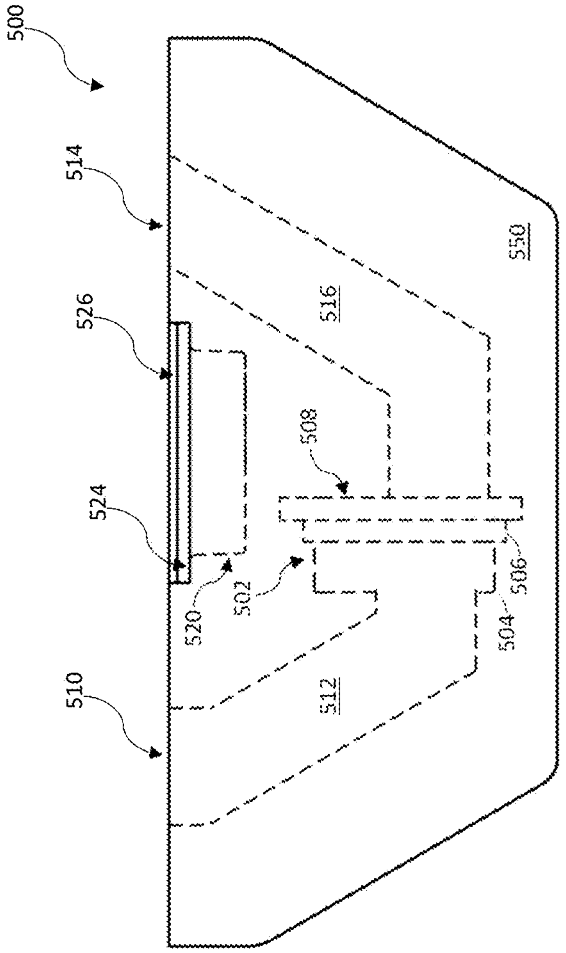
FIG. 5A depicts a cross-section view of an acoustic module with a centered port in accordance with another example.

FIG. 5A depicts a cross-section view of an acoustic module 500 with a centered sound port in accordance with another example. The acoustic module 500 is generally similar to the acoustic module 100 of FIG. 1A and includes like-numbered elements with the acoustic module 100 that are not discussed in detail below for the purpose of brevity. The acoustic module 500 includes a directional acoustic sensor device 502 and an omnidirectional acoustic sensor device 520. The directional microphone 502 includes a PCB 506 that is mounted on or otherwise supported by a product PCB 508. In some examples, the product PCB 508 may be a flexible printed circuit board. In some instances, a stiffener may be used in combination with the product PCB 508 in order to ensure the flexible PCB 508 is rigid in the portion on which the acoustic sensor device 502 is mounted, but flexible throughout its other portions.

The omnidirectional acoustic sensor device 520 includes a PCB 524 that is mounted on or otherwise supported by a product PCB 526. In some examples, the product PCB 526 may be a flexible printed circuit board. A stiffener for the omnidirectional acoustic sensor device 520 may be included similarly to the directional acoustic sensor device 502. In some examples, the product PCB 508 and 526 may be the same PCB. In other examples the product PCB 508 and 526 may be different PCBs.

The directional acoustic sensor device 502 and omnidirectional acoustic sensor device 520 are both integrated within a gasket 550 along with their respective product PCBs 508 and 526. The gasket 550 may include one or multiple gasket pieces. The one or multiple gasket pieces may include any one of or a combination of a rubber, plastic, adhesive, or metal.

Embedded in the gasket 550 is a first acoustic channel 512 and a second acoustic channel 516. The first acoustic channel 512 couples a first sound port embedded in the lid 504 of the directional acoustic sensor device 502 to a first sound port 514 embedded on the top side of the gasket 550. This exposes the first sound port of the directional acoustic sensor device 502 to the ambient environment.

The second acoustic channel 516 couples a second sound port embedded in the PCB 506 of the directional acoustic sensor device 502 to a second sound port 514 embedded on the top side of the gasket 550. This exposes the second sound port of the directional acoustic sensor device 502 to the ambient environment. It should be noted that in some examples, the acoustic channels 512, 516 may differ from each other in size and/or volume. For example, an acoustic length and of the acoustic channel 512 may be shorter than the acoustic length of the acoustic channel 516. As another example, a size (e.g., diameter) of the acoustic channel 512 may be shorter than a size (e.g., a diameter) of the acoustic channel 516. Such differences in size and/or volume of the acoustic channels 512, 516 may ensure consistent directional response from the directional acoustic sensor device 502

When integrating the directional acoustic sensor device 502 into the gasket 550, there is space above the acoustic sensor device and acoustic channels 512 and 516. The omnidirectional acoustic sensor device 520 is placed within that space, in order to minimize the size of the acoustic module 500. The omnidirectional acoustic sensor device is coupled to a sound port on the top surface of the gasket 550 that sits in between the sound ports 510 and 514. In some examples, the orientation of the omnidirectional acoustic sensor device 520 is flipped relative to the directional acoustic sensor device 502 such that the PCBs 506 and 524 lay on different planes. This helps minimize the total thickness of the acoustic module 500.

Figure 5B:
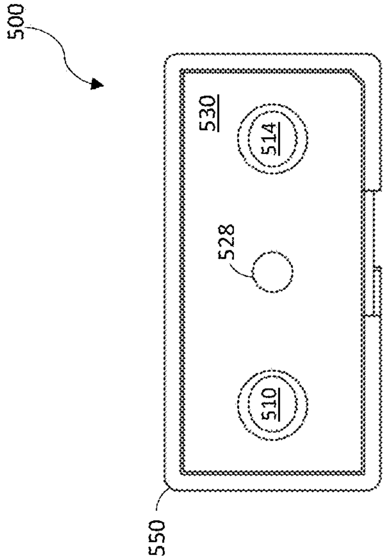
FIG. 5B depicts a top view of the acoustic module of FIG. 5A in accordance with an example.

FIG. 5B depicts a top view of the acoustic module 500. The omnidirectional acoustic sensor device 520 couples to a centered sound port 528 that sits in between the sound ports 510 and 514. The sound ports 510, 514, and 528 are all aligned and symmetric with respective to the centered sound port 528. This ensures that the industrial design (ID) in the end product the acoustic module 500 is coupled to has an aesthetically pleasing and symmetric look with its sound ports.

The acoustic module 500 further comprises a material stack 530 that sits on top of the gasket 550. The material stack 530 may comprise an adhesive layer to help in the attachment and placement of the acoustic module 500 to the enclosure of the product into which the acoustic module 500 is integrated. Embedded within the material stack 530 may also be an acoustic mesh that is used to protect one or more of the sound ports 510, 514, and 528. The acoustic mesh may be used to prevent particles or liquid from entering the acoustic channels embedded in gasket 550, while minimally affecting the sensitivities of acoustic sensor devices 502 and 520. The material stack 530 may or may not also include a compressible foam. When the acoustic module 500 is coupled to an end product enclosure, the foam may be compressed to aid the assembly and ensure a proper seal with the end product.

Examples are described in which acoustic modules include a sound port configured to couple an omnidirectional acoustic sensor device to an ambient environment is aligned with a midpoint between two sound ports configured to couple a directional acoustic sensor device to the ambient environment. The sound port configured to couple the omnidirectional acoustic sensor device to the ambient environment may thus be centered with respect to the two sound ports configured to couple a directional acoustic sensor device to the ambient environment. In some examples, output signals of the omnidirectional acoustic sensor device and the directional acoustics sensor device may be combined to generate a combined output signal having a desired directionality pattern, such as a cardioid directionality pattern, a hypercardioid directionality pattern, a supercardioid directionality pattern, or a subcardioid directionality pattern. For example, the omnidirectional acoustic sensor device and the directional acoustic sensor device may be coupled to a processor configured to implement a signal processing method in which output signals from the omnidirectional acoustic sensor device and the directional acoustic sensor device are summed or otherwise combined. The combination may follow processing by respective phase matching and weighting filters. The signal processing method may further include additional filtering after the combination, including, for instance, frequency response matching. In at least some examples, the position of the sound port configured to couple the omnidirectional acoustic sensor device to the ambient environment aligned with a midpoint between the two sound ports configured to couple the directional acoustic sensor device to the ambient environment may minimize or otherwise reduce frequency dependencies created by combining the output signal of the directional acoustic sensor device and the output signal of the omnidirectional acoustic sensor device.

The terms "about" or "approximately" are used herein in a manner to include deviations from a specified value that would be understood by one of ordinary skill in the art to effectively be the same as the specified value due to, for instance, the absence of appreciable, detectable, or otherwise effective difference in operation, outcome, characteristic, or other aspect of the disclosed methods, modules, systems, and devices.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. An acoustic module, comprising:

a plurality of acoustic sensor devices, including at least a first acoustic sensor device and a second acoustic sensor device; and a plurality of sound ports configured to couple the plurality of acoustic sensor devices to an ambient environment, the plurality of sound ports including at least a first sound port, a second sound port, and a third sound port, wherein the first acoustic sensor device includes a first transducer having a first side coupled to an ambient environment via the first sound port and a second side coupled to the ambient environment via the second sound port such that the first acoustic sensor device has a directional response to sound waves in the ambient environment, the second acoustic sensor device includes a second transducer exposed to the ambient environment on one side via the third sound port such that the second acoustic sensor device has an omnidirectional response to sound waves in the ambient environment, and the first sound port, the second sound port, and the third sound port are positioned in the acoustic module such that the third sound port is at least approximately aligned with a midpoint between the first sound port and the second sound port.

2. The acoustic module of claim 1, wherein:

the first sound port is spaced from the second sound port by a distance along a line connecting the first sound port and the second sound port; and the midpoint lies at least approximately halfway along the distance between the first sound port and the second sound port.

3. The acoustic module of claim 2, wherein the third sound port is disposed at a position along an axis that is approximately perpendicular to the line connecting the first sound port and the second sound port.

4. The acoustic module of claim 3, wherein the third sound port is disposed at a position along the axis within a plane that i) is perpendicular to the line connecting the first sound port and the second sound port and ii) crosses the line connecting the first sound port and the second sound port at the midpoint.

5. The acoustic module of claim 1, wherein the third sound port is positioned at the midpoint between the first sound port and the second sound port.

6. The acoustic module of claim 1, wherein each of one or both of the first transducer and the second transducer comprises a microelectromechanical system (MEMS) transducer.

7. The acoustic module of claim 1, wherein each of one or both of the first acoustic sensor device and the second acoustic sensor device comprises a microelectromechanical system (MEMS) microphone.

8. The acoustic module of claim 1, wherein the first acoustic sensor device is configured to have a dipole directionality pattern.

9. The acoustic module of claim 1, wherein the first acoustic sensor device and the second acoustic sensor device are coupled to a processor configured to combine a first signal generated by the first acoustic sensor device and a second signal generated by the second acoustic sensor device to generate a combined output signal of the acoustic module.

10. The acoustic module of claim 9, wherein the processor is configured to combine the first signal generated by the first acoustic sensor device and the second signal generated by the first acoustic sensor device to generate a combined output signal having one of a cardioid directionality pattern, a hypercardioid directionality pattern, a supercardioid directionality pattern, or a subcardioid directionality pattern.

11. The acoustic module of claim 9, wherein the processor is configured to, prior to combining the first signal and the second signal, filter the first signal and the second signal so that one or both i) a frequency response of the first signal matches a frequency response of the second signal and ii) a phase response of the first signal matches a phase response of the second signal.

12. An acoustic module, comprising:

a first acoustic sensor device including a first transducer having a first side coupled to an ambient environment via a first acoustic channel coupled to a first sound port and a second side coupled to the ambient environment via a second acoustic channel coupled to a second sound port such that the first acoustic sensor device exhibits a directional response to soundwaves in the ambient environment; and a second acoustic sensor device including a second transducer exposed to the ambient environment on one side via a third acoustic channel coupled to a third sound port such that the second acoustic sensor device exhibits an omnidirectional response to the soundwaves in the ambient environment, wherein the first sound port, the second sound port, and the third sound port are positioned in the acoustic module such that the third sound port is at least approximately aligned with a midpoint between the first sound port and the second sound port.

13. The acoustic module of claim 12, wherein:

the first sound port is spaced from the second sound port by a distance along a line connecting the first sound port and the second sound port; and the midpoint lies at least approximately halfway along the distance between the first sound port and the second sound port.

14. The acoustic module of claim 13, wherein the third sound port is disposed at a position along an axis that is approximately perpendicular to the line connecting the first sound port and the second sound port.

15. The acoustic module of claim 14, wherein the third sound port is disposed at a position along the axis within a plane that i) is perpendicular to the line connecting the first sound port and the second sound port and ii) crosses the line connecting the first sound port and the second sound port at the midpoint.

16. The acoustic module of claim 12, wherein the third sound port is positioned at the midpoint between the first sound port and the second sound port.

17. The acoustic module of claim 12, wherein each of one or both of the first transducer and the second transducer comprises a microelectromechanical system (MEMS) transducer.

18. The acoustic module of claim 12, wherein the first acoustic sensor device is configured to have a dipole directionality pattern.

19. The acoustic module of claim 18, wherein the first acoustic sensor device and the second acoustic sensor device are coupled to configured to combine a dipole signal generated by the first acoustic sensor device and an omnidirectional signal generated by the second acoustic sensor device to generate a combined output signal having one of a cardioid directionality pattern, a hypercardioid directionality pattern, a supercardioid directionality pattern, or a subcardioid directionality pattern.

* * * * *